(12) United States Patent
Szu et al.

(10) Patent No.: US 6,560,112 B1
(45) Date of Patent: May 6, 2003

(54) FIXING APPARATUS FOR HEAT SINK

(75) Inventors: Ming-Lun Szu, Tu-Chen (TW); Hao-Yun Mar, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/052,280

(22) Filed: Jan. 17, 2002

(51) Int. Cl.$^7$ .................................. H05K 7/20
(52) U.S. Cl. .................. 361/719; 257/719; 403/270
(58) Field of Search ....................... 257/718, 719, 257/722, 726, 727; 248/505, 510; 165/80.3, 185, 121–126; 361/687, 695, 697, 703, 704, 709–712, 717–720; 415/213.1, 214.1; 403/265, 270

(56) References Cited

U.S. PATENT DOCUMENTS 5,175,668 A * 12/1992 Kendel ..................... 361/720
5,883,782 A * 3/1999 Thurston et al. ............ 361/704
6,088,228 A * 7/2000 Petersen et al. ............ 361/720
6,105,215 A * 8/2000 Lee ............................. 24/458
6,392,889 B1 * 5/2002 Lee et al. .................... 361/704
6,480,387 B1 * 11/2002 Lee et al. .................... 361/704
6,483,708 B2 * 11/2002 Ali et al. ..................... 361/719

* cited by examiner

Primary Examiner—Gerald Tolin
(74) Attorney, Agent, or Firm—WeiTe Chung

(57) ABSTRACT

A fixing apparatus includes a retention module (30), four rivets (10), and a back plate (50). The retention module is attached on a motherboard (60), the motherboard defining four orifices (62) therein. The retention module defines four through holes (31) therein. The back plate is attached on an underside of the motherboard, for reinforcing the motherboard. The back plate defines four apertures (52) therein. Four posts (34) depend from the retention module through the orifices and the apertures. A bore (36) is defined through each post, and in axial alignment with a corresponding through hole. The rivets are inserted through the through holes and the bores such that the posts are firmly engaged with the motherboard and the back plate.

17 Claims, 6 Drawing Sheets

FIXING APPARATUS FOR HEAT SINK

BACKGROUND OF THE INVENTION

1. Field of the Invention

The present invention relates to fixing apparatuses, and more particularly to a fixing apparatus for a heat sink in a computer.

2. Description of Related Art

Computer electronic devices such as central processing units (CPUs) frequently generate large amounts of heat, which can destabilize operation and cause damage. A heat sink placed in thermal contact with an electronic device transfers heat from the electronic device through conduction.

A conventional heat sink assembly comprises a heat sink and a fixing apparatus for attaching the heat sink to a motherboard. The fixing apparatus comprises a retention module, a back plate and a plurality of clips. The retention module is securely attached on the motherboard, for facilitating attachment of the heat sink to the motherboard. The back plate is located below the motherboard with the clips, for reinforcing the motherboard. Unfortunately, the retention module and the back plate are fastened to the motherboard with screws. Attachment of the fixing apparatus to the motherboard is unduly laborious and time-consuming. Furthermore, a tool is required to perform such attachment.

It is strongly desired to provide an improved fixing apparatus which overcomes the above problems.

SUMMARY OF THE INVENTION

Accordingly, an object of the present invention is to provide a fixing apparatus which comprises a retention module and a back plate secured to a motherboard.

Another object of the present invention is to provide a fixing apparatus having a retention module and a back plate which are conveniently and firmly secured to a motherboard without any tools.

In order to achieve the objects set out above, a fixing apparatus includes a retention module, four rivets and a back plate. The retention module is attached on a motherboard, the motherboard defining four orifices therein. The retention module defines four through holes therein. The back plate is attached on an underside of the motherboard, for reinforcing the motherboard. The back plate defines four apertures therein. Four posts depend from the retention module through the orifices and the apertures. A bore is defined through each post, and in axial alignment with a corresponding through hole. The rivets are inserted through the through holes and the bores such that the posts are firmly engaged with the motherboard and the back plate.

Other objects, advantages and novel features of the present invention will become more apparent from the following detailed description when taken in conjunction with the accompanying drawings.

DETAILED DESCRIPTION OF THE INVENTION

Figure 1:
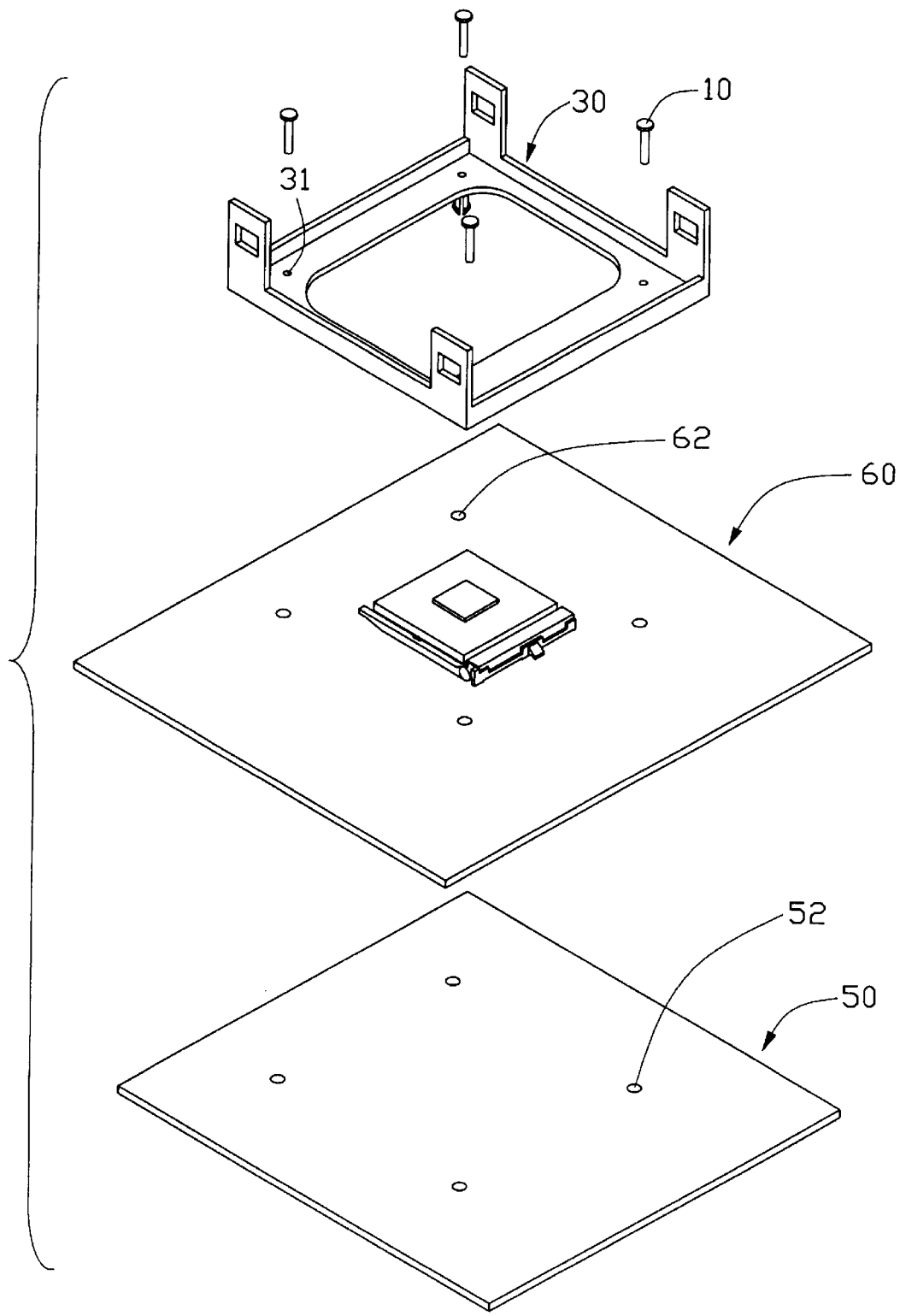
FIG. 1 is an exploded perspective view of a fixing apparatus in accordance with a first preferred embodiment of the present invention, together with a motherboard, a socket and a CPU.

Reference will now be made to the drawing figures to describe several embodiments of the present invention in detail.

FIG. 1 shows a fixing apparatus in accordance with a first preferred embodiment of the present invention, together with a motherboard 60. The fixing apparatus comprises a rectangular retention module 30, four rivets or pins 10, and a back plate 50. A CPU socket (not labeled) is mounted on the motherboard 60, to support a CPU (not labeled) thereon. Four orifices 62 are defined in the motherboard 60, surrounding the CPU socket.

The back plate 50 is for reinforcing the motherboard 60. The back plate 50 is made of metal. Four evenly spaced apertures 52 are defined in the back plate 50, corresponding to the orifices 62 of the motherboard 60.

The retention module 30 is for attaching on the motherboard 60 and thereby retaining a heat sink (not shown) in contact with the CPU on the motherboard 60. Four through holes 31 are defined in the retention module 30, respectively adjacent four corners thereof.

Figure 2:
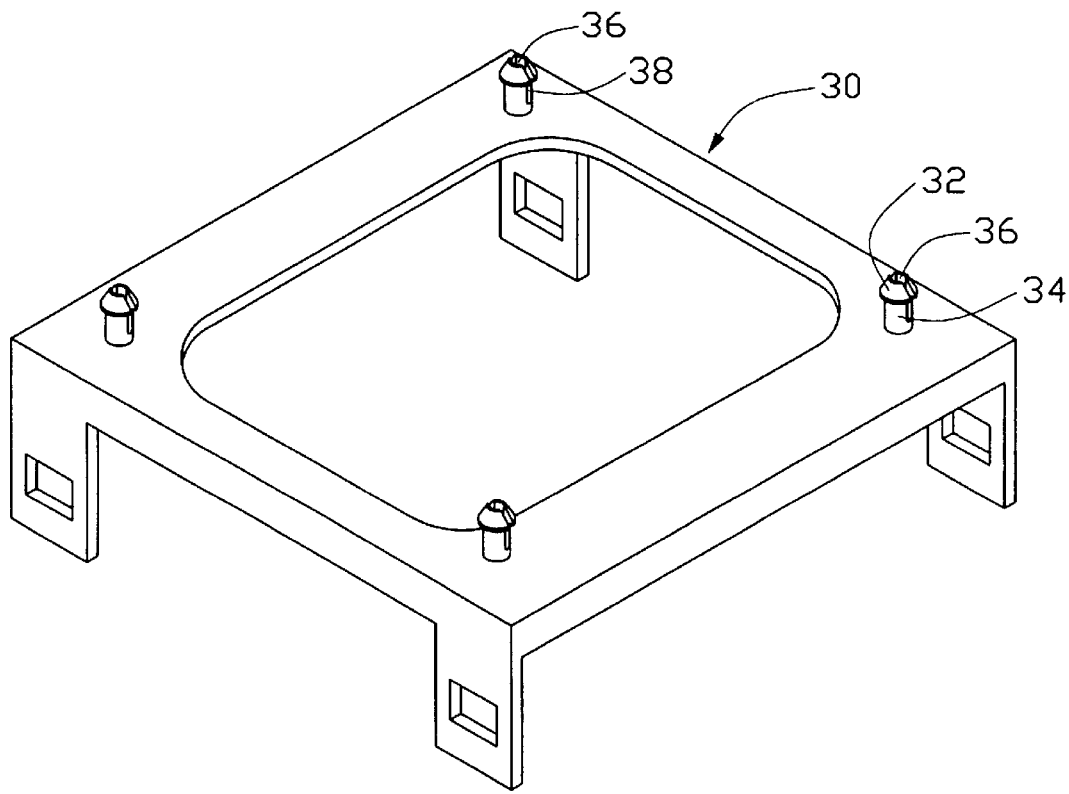
FIG. 2 is a perspective view of a retention module of the fixing apparatus of FIG. 1, viewed from a bottom thereof.
Figure 3:
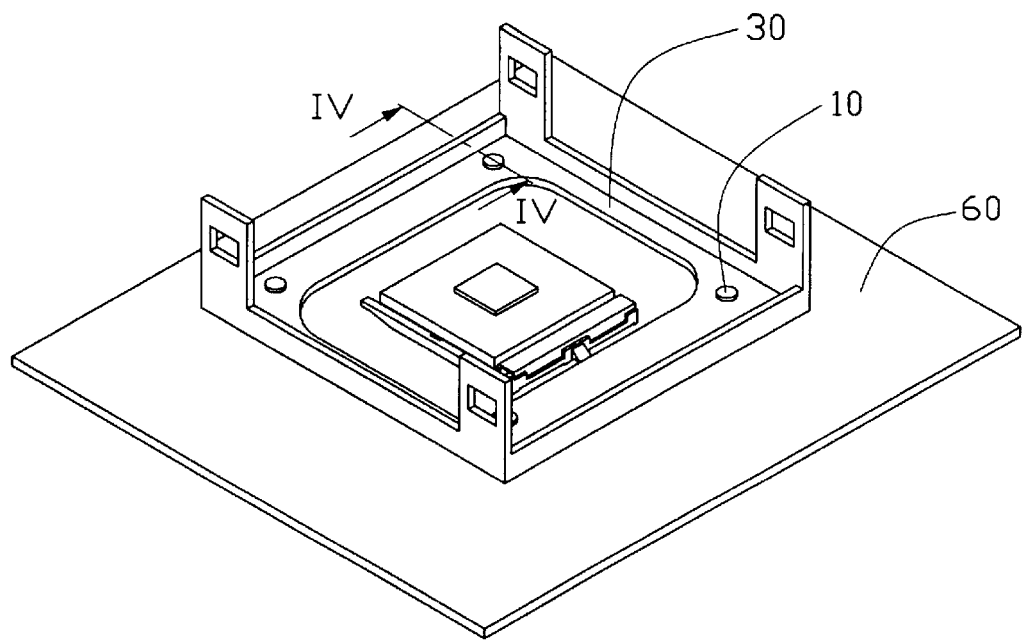
FIG. 3 is an assembled view of FIG. 1.
Figure 4:
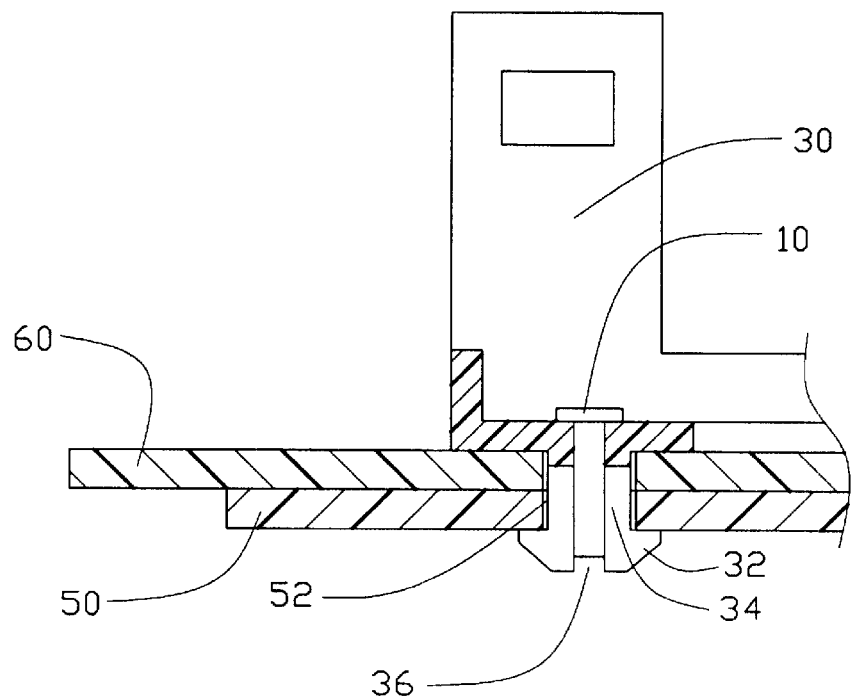
FIG. 4 is a cross-sectional view taken along line IV—IV of FIG. 3.

Referring particularly to FIG. 2, four posts 34 respectively depend from four corners of the retention module 30, for extending through the orifices 62 of the motherboard 60 and the apertures 52 of the back plate 50. Each post 34 of the retention module 30 defines a bore 36 therein, in axial alignment with a corresponding through hole 31. A tapered hood 32 is formed at a free end of each post 34. A largest diameter of the tapered hood 32 is greater than a diameter of the post 34. A cutout 38 is defined in the free end of each post 34, to provide the post 34 with resiliency. The posts 34 can therefore be easily extended through the orifices 62 and the apertures 52.

Referring to FIGS. 1–4, in assembly, the retention module 30 is placed onto the motherboard 60. The posts 34 are extended through the orifices 62 and the apertures 52. The hoods 32 protrude below the apertures 52, and are fittingly engaged with the back plate 50. The rivets 10 are inserted into the through holes 31 and the bores 36 with the enlarged caps (not labeled) abutting against the retention module 30, to push the posts 34 radially outwardly against the motherboard 60 and the back plate 50. Thus, the posts 34 are firmly engaged with the motherboard 60 and the back plate 50.

Figure 5:
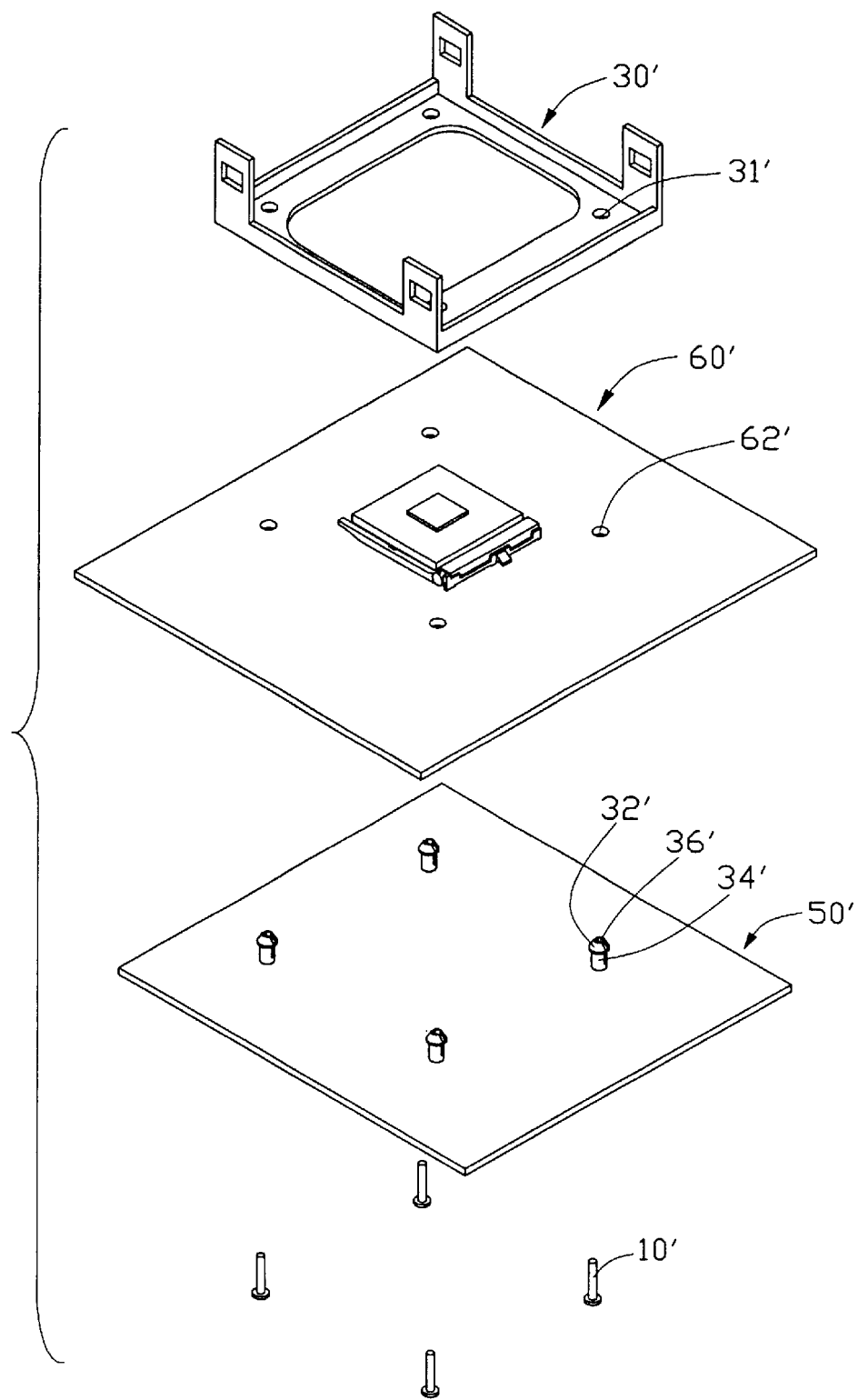
FIG. 5 is an exploded perspective view of a fixing apparatus in accordance with a second preferred embodiment of the present invention, together with a motherboard, a socket and a CPU.

FIG. 5 shows a fixing apparatus in accordance with a second preferred embodiment of the present invention, together with a motherboard 60' on which a socket (not labeled) and a CPU (not labeled) are mounted. The fixing apparatus comprises a rectangular retention module 30', four posts 34' and a back plate 50'. The retention module 30' is the same as the retention module 30 of the first preferred embodiment, but without the posts 34 of the retention module 30. The back plate 50' is the same as the back plate 50 of the first preferred embodiment, but with four posts 34' extending upwardly from the back plate 50'. The posts 34' are the same as the posts 34 of the first preferred embodiment. The posts 34' each define a bore 36' in axial alignment with an aperture 52' of the back plate 50' (see FIG. 7).

Figure 6:
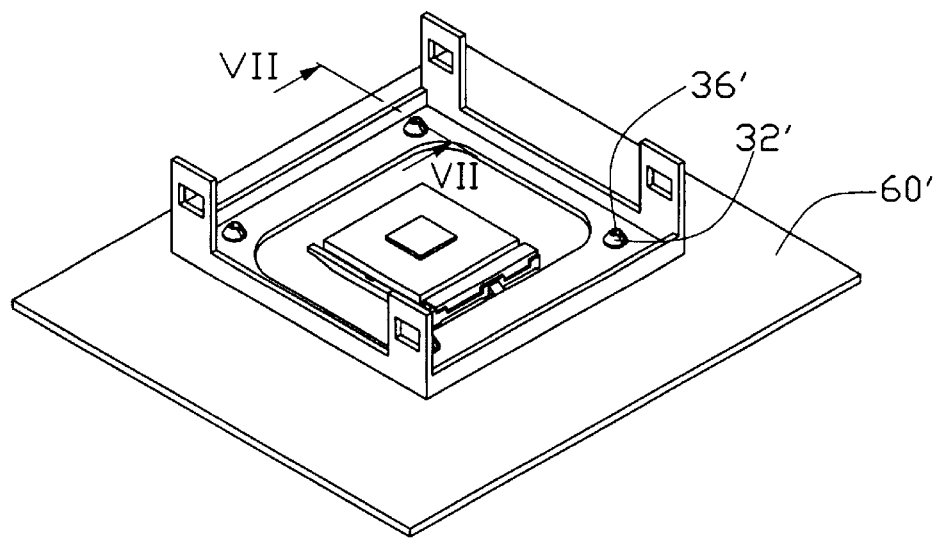
FIG. 6 is an assembled view of FIG. 5.
Figure 7:
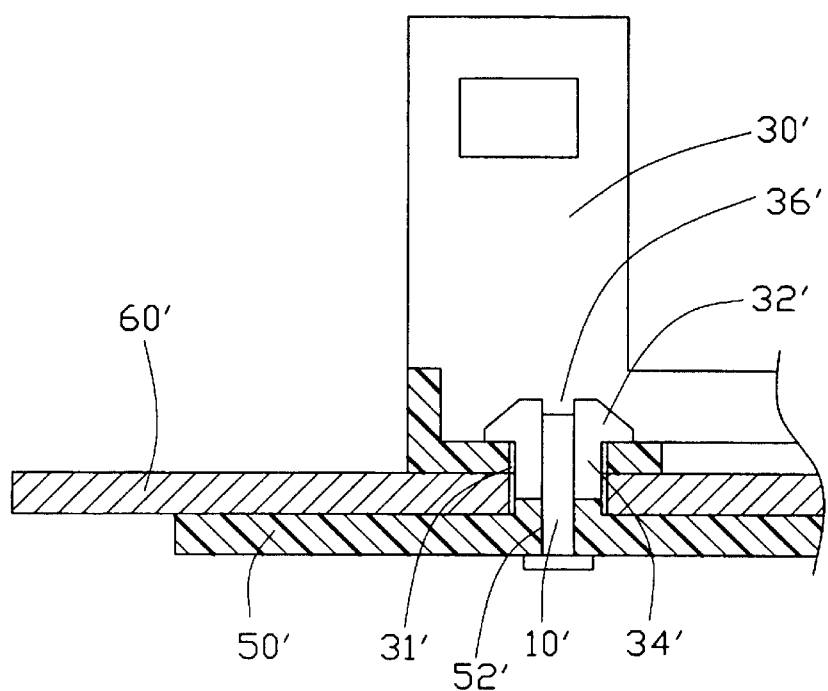
FIG. 7 is a cross-sectional view taken along line VII—VII of FIG. 6.

Referring to FIGS. 5–7, in assembly, the posts 34' are extended through orifices 62' of the motherboard 60' and through holes 31' of the retention module 30'. Hoods 32' of the posts 34' protrude above the through holes 31', and are fittingly engaged with the retention module 30'. Four rivets 10' are inserted into the apertures 52' and the bores 36' to push the posts 34' radially outwardly against the motherboard 60' and the retention module 30'. Thus, the posts 34' are firmly engaged with the motherboard 60' and the retention module 30'.

Figure 8:
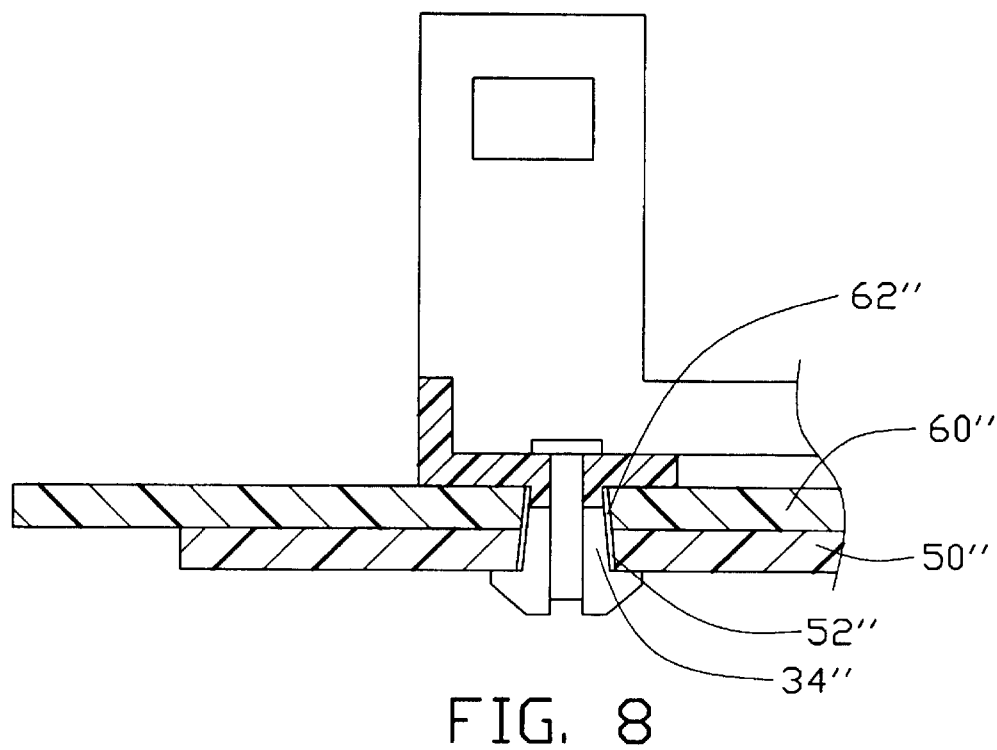
FIG. 8 is a cross-sectional view of part of a fixing apparatus in accordance with a third preferred embodiment of the present invention, together with part of a motherboard to which said fixing apparatus is engaged.

FIG. 8 shows a fixing apparatus in accordance with a third preferred embodiment of the present invention, which is similar to the fixing apparatus of the first preferred embodiment. The difference is that each post 34" has a gradually increasing outer diameter from a top thereof to a bottom thereof. The orifices 62" of the motherboard 60" and the apertures 52" of the back plate 50" each also have a gradually increasing diameter from a top thereof to a bottom thereof, to correspond with the posts 34".

Figure 9:
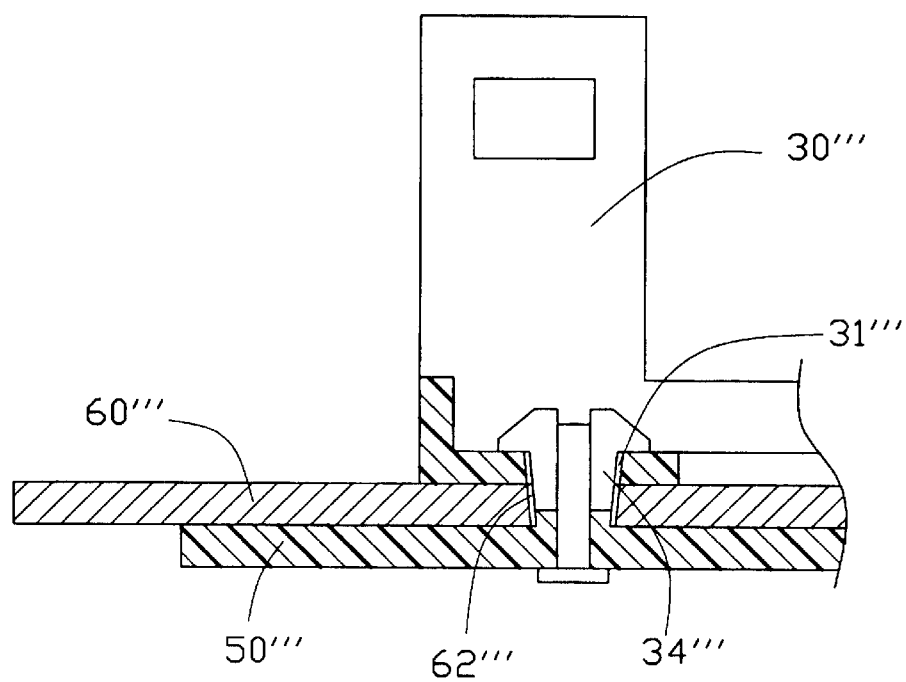
FIG. 9 is a cross-sectional view of part of a fixing apparatus in accordance with a fourth preferred embodiment of the present invention, together with part of a motherboard to which said fixing apparatus is engaged.

FIG. 9 shows a fixing apparatus in accordance with a fourth preferred embodiment of the present invention, which is similar to the fixing apparatus of the second preferred embodiment. The difference is that each post 34''' has a gradually increasing outer diameter from a bottom thereof to a top thereof. The orifices 62''' of the motherboard 60''' and the through holes 31''' of the retention module 30''' each also have a gradually increasing diameter from a bottom thereof to a top thereof, to correspond with the posts 34'''.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fixing apparatus assembly comprising:
   a motherboard defining a plurality of orifices;
   a back plate attached on an underside of the motherboard to reinforce the motherboard;
   a retention module attached on top of the motherboard;
   a plurality of posts extending through the orifices and further connecting with the back plate and the retention module, bores being defined in the posts, respectively; and
   a plurality of rivets inserted into the bores of the posts such that the posts are firmly engaged with the motherboard, the back plate and the retention module.

2. The fixing apparatus as claimed in claim 1, wherein a tapered hood is formed at a free end of each of the posts.

3. The fixing apparatus as claimed in claim 2, wherein a cutout is defined in the free end of each of the posts, to provide the posts with resiliency.

4. The fixing apparatus as claimed in claim 3, wherein the back plate defines a plurality of apertures, and the retention module defines a plurality of through holes, the apertures and the through holes being respectively in communication with the orifices of the motherboard.

5. The fixing apparatus as claimed in claim 4, wherein the posts depend from the retention module through the apertures.

6. The fixing apparatus as claimed in claim 5, wherein the bores are respectively in axial alignment with the through holes.

7. The fixing apparatus as claimed in claim 5, wherein the rivets are inserted through the through holes and the bores.

8. The fixing apparatus as claimed in claim 5, wherein the hoods are disposed below and fittingly engaged with the back plate.

9. The fixing apparatus as claimed in claim 5, wherein each of the posts has a gradually increasing diameter from one end thereof to an opposite end thereof, and the orifices and the apertures each have gradually increasing diameters to correspond with the posts.

10. The fixing apparatus as claimed in claim 4, wherein the posts extend upwardly from the back plate through the through holes.

11. The fixing apparatus as claimed in claim 10, wherein the bores are respectively in axial alignment with the apertures.

12. The fixing apparatus as claimed in claim 10, wherein the rivets are inserted through the apertures and the bores.

13. The fixing apparatus as claimed in claim 10, wherein the hoods are disposed on and fittingly engaged with the retention module.

14. The fixing apparatus as claimed in claim 10, wherein each of the posts has a gradually increasing diameter from one end thereof to an opposite end thereof, and the orifices and the through holes each have gradually increasing diameters to correspond with the posts.

15. A fixing apparatus assembly, comprising:
   a motherboard defining a plurality of orifices;
   a back plate attached on an underside of the motherboard, the back plate defining a plurality of apertures in alignment with the orifices;
   a retention module attached on top of the motherboard, the retention module defining a plurality of through holes in alignment with the orifices;
   a plurality of posts extending downwardly from the retention module through the orifices and the apertures, said posts each forming a tapered hood at a free end thereof, said hoods engaging with an underside of the back plate; and
   a plurality of rivets inserted into the posts, respectively, to cause the posts to firmly engage with the motherboard and the back plate.

16. An electrical assembly comprising:
   a mother board defining an plurality of orifices and opposite first and second surfaces;
   a CPU socket, with a CPU thereon, being soldered on the first surface of the mother board;
   a retention module defining an central opening receiving said CPU socket therein, said retention module seated upon said first surface; and
   a back plate disposed on the second surface of the mother board so as to cooperate with said retention module to sandwich said mother board therebetween;
   a plurality of tubular retention posts integrally extending from one of said retention module and said back plate in vertical alignment with the corresponding orifices, respectively, toward the other of said retention module and said back plate, and said other of said retention module and said back plate forming a plurality of apertures in vertical alignment with the corresponding posts and orifices, respectively, wherein each of said retention posts extends through the corresponding orifice and the corresponding aperture with a distal hook section latchably engaged the other of said retention module and said back plate under a condition that a discrete pin extends through said each of the retention posts toward the other of said retention module and said back plate for preventing inwardly radially deformation of the said each of the retention posts, with an enlarged cap abutting against said one of said retention module and said back plate.

17. The assembly as claimed in claim 16, wherein each of said tubular posts defines a gradually increasing outer diameter from a root to the distal end thereof, and the corresponding orifice and the corresponding aperture both define gradually increasing inner diameters to comply with said gradually increasing diameter.

* * * * *